US009024239B2

United States Patent
Liotard et al.

(10) Patent No.: US 9,024,239 B2
(45) Date of Patent: May 5, 2015

(54) OPTIC INSTRUMENT WITH WAVEFRONT ANALYSER

(71) Applicant: Thales, Neuilly-sur-Seine (FR)

(72) Inventors: Arnaud Liotard, Grasse (FR); Marc Bernot, Cannes la Bocca (FR); Frédéric Falzon, Pegomas (FR); Guillaume Perrin, Tassin-la-Demi-Lune (FR)

(73) Assignee: Thales, Courbevoie (FR)

( * ) Notice: Subject to any disclaimer, the term of this patent is extended or adjusted under 35 U.S.C. 154(b) by 70 days.

(21) Appl. No.: 14/026,923

(22) Filed: Sep. 13, 2013

(65) Prior Publication Data

US 2014/0077064 A1 Mar. 20, 2014

(30) Foreign Application Priority Data

Sep. 14, 2012 (FR) ...................................... 12 02452

(51) Int. Cl.
 *H01L 27/146* (2006.01)
 *G01J 9/00* (2006.01)
(52) U.S. Cl.
 CPC ............. *H01L 27/14629* (2013.01); *G01J 9/00* (2013.01)
(58) Field of Classification Search
 CPC ............................ H01L 27/14629; G01J 9/00
 USPC ......... 250/201.9, 201.2, 208.1; 356/491–492; 382/155–157
 See application file for complete search history.

(56) References Cited

U.S. PATENT DOCUMENTS

| 4,309,602 | A | 1/1982 | Gonsalves et al. | |
|---|---|---|---|---|
| 5,598,261 | A | 1/1997 | Duncan et al. | |
| 5,610,707 | A | 3/1997 | Duncan et al. | |
| 7,274,442 | B2 | 9/2007 | Dolne et al. | |
| 7,397,540 | B2 * | 7/2008 | Lundgren et al. | 356/4.03 |
| 7,531,774 | B2 * | 5/2009 | Paxman et al. | 250/201.9 |
| 7,864,333 | B1 * | 1/2011 | Olczak et al. | 356/491 |
| 8,004,688 | B2 * | 8/2011 | Davidson et al. | 356/497 |
| 8,351,738 | B2 | 1/2013 | Cassaing et al. | |

(Continued)

FOREIGN PATENT DOCUMENTS

| CN | 102636271 A | 5/2012 |
|---|---|---|
| CN | 102564612 A | 7/2012 |
| FR | 2919052 A1 | 1/2009 |

OTHER PUBLICATIONS

Robert A. Gonsalves, "Phase Retrieval and Diversity in Adaptive Optics", Optical Engineering, Sep./Oct. 1982, pp. 829-832, vol. 21, No. 5.

(Continued)

*Primary Examiner* — Seung C Sohn
(74) *Attorney, Agent, or Firm* — Baker Hostetler LLP

(57) ABSTRACT

In the field of optic instruments comprising at least one optical architecture, a photoreception assembly and means for acquisition and analysis of the images arising from the said photoreception assembly, the acquisition and analysis means comprising an algorithm of phase diversity type, an optical architecture comprises an optical plate of low or zero optical power arranged in the vicinity of the photoreception assembly and disposed so as to form on all or part of the said assembly a first focused image and a second image defocused by a first predetermined value and shifted by a second predetermined value with respect to the first image. The optic instrument can advantageously be a space telescope.

9 Claims, 3 Drawing Sheets

(56) References Cited

U.S. PATENT DOCUMENTS

2004/0056174 A1 3/2004 Specht et al.
2004/0099787 A1 5/2004 Dolne et al.

OTHER PUBLICATIONS

Richard G. Paxman, et al., "Joint Estimation of Object and Aberrations by Using Phase Diversity", Optical Society of America, Jul. 1992, pp. 1072-1085, vol. 9, No. 7.

J.R. Fienup, et al., "Hubble Space Telescope Characterized by Using Phase-Retrieval Algorithms", Applied Optics, Apr. 1, 1993, pp. 1747-1767, vol. 32, No. 10.

M.G. Lofdahl, et al., "Wavefront Sensing and Image Restoration from Focused and Defocused Solar Images", Astronomy & Astrophysics, Supplement Series 107, Oct. 11, 1994, pp. 243-264.

Bruce H. Dean, et al., "Phase Retrieval Algorithm for JWST Flight and Testbed Telescope", Proc of SPIE, 2006, pp. 626511-1 thru 626511, vol. 6265.

R.L. Kendrick, et al., "Closed Loop Wave Front Correction Using Phase Diversity", SPIE Conference on Space Telescopes and Instruments V, Mar. 1998, pp. 844-853, vol. 3356.

D. Russell Luke, et al., "Optical Wavefront Reconstruction: Theory and Numerical Methods", SIAM Review, 2002, pp. 169-224, vol. 44.

\* cited by examiner

OPTIC INSTRUMENT WITH WAVEFRONT ANALYSER

CROSS-REFERENCE TO RELATED APPLICATION

This application claims priority to foreign French patent application No. FR 1202452, filed on Sep. 14, 2012, the disclosure of which is incorporated by reference in its entirety.

FIELD OF THE INVENTION

The general field of the invention is that of optic instruments comprising wavefront analysis means. One of the main areas of application is the making of space telescopes.

BACKGROUND

A space optic instrument or a space telescope comprises an optical focusing system generally comprising several mirrors and an image analysis device comprising photoreception means and computing means making it possible to ensure the processing of the images received. The photoreception means can be either a matrix of photoreceptors, or an assembly comprising one or more rows of photoreceptor arrays. In this case, the instrument comprises opto-mechanical means ensuring the scanning of the image.

Whatever the configuration employed, it is clear that one seeks to obtain the most precise possible images. Now, optic instruments are capable only of measuring a luminous intensity and the image phase information is therefore lost. For example, in a scanning optical system, the data acquired in the direction x of the rows of arrays and denoted $\{d(x)\}$ are noisy measurements of the convolution of the object observed, written $o(x,\lambda)$ at a wavelength $\lambda$, with the percussional response of the optical system or "PSF", the acronym standing for "Point Spread Function", and denoted $h(x,\lambda)$, integrated over the spectral band of intensity $f(\lambda)$ of the acquisition pathway.

We thus have relation 1:

$$d(x) = N[h*o(x)] = N\left[\int_\lambda (h(x,\lambda)*o(x,\lambda))f(\lambda)d\lambda\right] \quad \text{Relation 1}$$

The optical quality of the instrument is characterized by a phase error of the wavefront, also called the "WFE", the acronym standing for "Wave-Front Error". This WFE takes into account the aberrations of the mirrors of the telescope, and also the various defects of alignment of the mirrors constituting the telescope or of the detector with respect to the telescope. The WFE information is "contained" in the optical PSF of the system denoted $h^{OPT}(x,\lambda)$, the global PSF being equal to the convolution of the latter with other components related to the quality of the detector, to movements, etc. We thus have relation 2:

$$h^{OPT}(x,\lambda) = \left|TF^{-1}[A(p)e^{i\varphi(p,\lambda)}]\left(\frac{x}{\lambda F}\right)\right|^2 \quad \text{Relation 2}$$

where $A(p)$ and $\varphi(p,\lambda)$ are respectively the amplitude and the phase of the field at the level of the pupil of the instrument, F being the focal length of the instrument.

An estimation of the WFE is essential in so far as its knowledge makes it possible to correct all or part of the defects of the instrument so as to retrieve as clean an image as possible of the object. It requires the deployment of a dedicated device. This knowledge is indispensable when the instrument is active, that is to say it possesses means making it possible to correct the shape or the alignment of the mirrors so as to constantly retain as sharp as possible an image.

There exist various wavefront analysis solutions making it possible to retrieve the WFE. Generally, analysers are classed into two families, namely so-called "pupil plane" analysers and so-called "focal plane" analysers.

Among pupil plane analysers will mainly be noted the Shack-Hartmann method which consists in sampling the entrance pupil and in imaging in a dedicated pathway all of the observed scenes, so as to measure the WFE locally. The drawback of such an approach is the use of a part of the entrance flux for an "ancillary" analysis pathway, as well as the complexity of the optical device to be deployed.

Focal plane analysers do not have any such drawbacks, since they consist in using acquisitions carried out at the level of the focal plane of the instrument to estimate the wavefront. One way of treating this problem is, for example, to acquire two images of the same scene $o(x)$, one being defocused with respect to the other and to use an algorithm of phase diversity type. Phase diversity can be used for image restoration purposes, the aim is then to find $o(x)$, or for wavefront analysis purposes, the aim is in this case to find the WFE $\varphi(p)$, the WFE generally being parametrized as a linear combination of Zernike vectors representative of the focusing defect or of geometric aberrations such as astigmatism.

Analyses using phase diversity therefore make it possible to determine the WFE of the telescope on the basis of image acquisitions. This phase information can be used in an active optic system to correct it in closed-loop, or else a posteriori to restore the acquired data and thus improve the image quality.

A great many articles have been published, over nearly 30 years, on wavefront analysis using phase diversity and space applications of this analysis. The great majority propose diverse algorithmic approaches for solving this problem, others describe its application to particular goals when the object is known and pointlike. One then speaks of phase retrieval.

Mention will be made notably of the article by Gonsalves entitled "Phase retrieval and diversity in adaptive optics", Optical Engineering, 21, 1982 which is considered to be the seminal article on phase diversity.

Mention will also be made of the article by Paxman entitled "Joint estimation of object and aberrations by using phase diversity", Journal of the Optical Society of America A, 9(7), 1992 which makes reference to and which presents the most commonly used algorithmic approach.

Mention will be made also of the article by Fienup entitled "Hubble space telescope characterized by using phase retrieval algorithms", Applied Optics, 32(10):1747-1767, 1993; that by Löfdahl entitled "Wavefront sensing and image restoration from focused and defocused solar images", Astronomy and Astrophysics, 107:243-264, 1994 and finally that by Dean entitled "Phase retrieval algorithm for JWST flight testbed telescope, Space telescopes and Instrumentation", SPIE 6265, 2006 which present applications of phase diversity to concrete cases such as the study of sunspots, the adjustment of the Hubble telescope or "HST" for Hubble Space Telescope or that of the "JWST" ("James Webb Space Telescope") telescope.

The article by Kendrick entitled "Closed-loop wavefront correction using phase diversity", SPIE 3356 Space Telescopes and Instruments, 1998 describes a closed-loop approach, with a few architectural designs of phase diversity sensors.

Finally, the article by Luke entitled "Optical wavefront reconstruction: theory and numerical methods", SIAM review 44(2):169-224, 2002 presents a state of the art of the various algorithmic approaches.

Patents have also been filed on wavefront analysis either on the phase diversity algorithm, or on the means of simply creating the defocusings required by this phase diversity algorithm.

Mention will be made notably of U.S. Pat. No. 4,309,602 entitled "Wavefront sensing by phase retrieval" which describes the algorithmic approach and the framework of the use of a sensor-wavefront analysis-adaptive optics loop.

Mention will also be made of U.S. Pat. No. 5,598,261 entitled "Wavefront sensor for a scanning imager" which presents a concept using "TDI" for "Time Delay Integration" comprising two parallel detectors, the second one being defocused with respect to the first by the provision of a transparent substrate. This may involve defocusings added over all or some of the length of the detector or else at the level of inter-array zones.

Mention will also be made of U.S. Pat. No. 5,610,707 entitled "Wavefront sensor for a staring imager" which presents a concept similar to the above but adapted to a matrix sensor with use of a beam splitter to obtain the focused and defocused images.

Mention will be made of application US 2004/0099787A1 entitled "System and method for determining optical aberrations in scanning imaging systems by phase diversity" which presents a concept using TDI comprising two parallel detector rows, one thereof, potentially composed of several elements, being shifted along the optical axis with respect to the other so as to defocus the image.

Patents US 2004/0056174 entitled "Fast phase diversity wavefront correction using a neural network" and FR 2919052 entitled "Method for estimating at least one deformation of the wavefront of an optical system or of an object observed by the optical system and associated device" present an adaptation of the algorithmic part for fast-calculation requirements.

Finally, U.S. Pat. No. 7,274,442 entitled "Closed loop wavefront sensor using field programmable gate array" presents an architectural approach of the onboard algorithmic processing, combining the use of phase diversity sensors and FPGAs.

SUMMARY OF THE INVENTION

The object of the device according to the invention is to propose opto-mechanical adaptations of an optical system, notably a telescope, making it possible to simply create the defocusings required by a phase diversity algorithm.

More precisely, the subject of the invention is an optic instrument comprising at least:
- an optical architecture comprising an optical assembly intended to make an image of a luminous object,
- a photoreception assembly and means for acquisition and analysis of the said image, the said acquisition and analysis means comprising an algorithm of phase diversity type,
- characterized in that the optical architecture comprises an optical plate of low or zero optical power arranged in the vicinity of the photoreception assembly and disposed so as to form on all or part of the said assembly a first focused image and a second image defocused by a first predetermined value and shifted by a second predetermined value with respect to the first image.

Advantageously, the instrument having an optical axis, the optical plate is a plate with mutually parallel plane faces perpendicular to the optical axis, the first image being obtained in simple transmission through the said optical plate, the second image being obtained in transmission after double reflection on the two faces of the plate, the optical plate being situated preferably at the edge of the photoreception assembly.

Advantageously, the instrument having an optical axis, the optical plate is a plate with plane and parallel faces, inclined to the optical axis, the first image being obtained in simple transmission through the said optical plate, the second image being obtained in transmission after double reflection on the two faces of the plate.

Advantageously, the optical plate is a prism with plane faces, the first image being obtained in simple transmission through the said prism, the second image being obtained in transmission after double reflection on the two faces of the said prism.

Advantageously, the optical plate is an air plate whose faces are on the one hand the entrance face of the photoreception assembly and on the other hand one of the faces of a protection window arranged in front of the said photoreception assembly, the first image being obtained in simple transmission through the said protection window, the second image being obtained in transmission after double reflection on the entrance face of the photoreception assembly and on the face of the protection window.

Advantageously, the optical plate is a Mangin mirror, that is to say an optical plate comprising a first semi-reflecting face and a second reflecting face, the first image being obtained by reflection on the first semi-reflecting face, the second image being obtained by reflection on the second reflecting face.

Advantageously, the optical plate comprises one or two reflecting treatments such that the amplitude of the first focused image is of the same order of magnitude as the amplitude of the second defocused image.

Advantageously, the optic instrument is a space telescope.

BRIEF DESCRIPTION OF THE DRAWINGS

The invention will be better understood and other advantages will become apparent on reading the nonlimiting description which follows and by virtue of the appended figures among which.

DETAILED DESCRIPTION

The object of the invention is to introduce, into the optical architecture of an optical system, an optical plate making it possible to simply create the defocusings required by a phase diversity algorithm. The invention applies most particularly to the area of telescopes and more precisely to the area of space telescopes.

There exist various possible arrangements by which the sought-after result may be obtained.

By way of nonlimiting examples, FIGS. 1 to 6 propose four different embodiments. In each of these various embodiments, the optical plate covers the whole of the field of the sensor. Of course, depending on the applications, it may cover only a part thereof, dedicated to image analysis.

In these figures, the optical architecture is reduced to a focusing lens 1. In the general case, this architecture is substantially more complex and generally comprises several mirrors. In the same manner, in these figures, the optical plate 2 is the last optical element situated just before the photoreception assembly 3. It is possible to envisage other configurations. In the various figures, the elements 1, 2 and 3 are represented by bold lines and the light rays by slender lines. The optical axis X-X of the lens 1 is represented dotted. In these various figures, the initial luminous object whose focusing lens 1 gives an image is not represented. In the general case, the object is a large distance away and it is considered that it is optically at "infinity".

Figure 1:
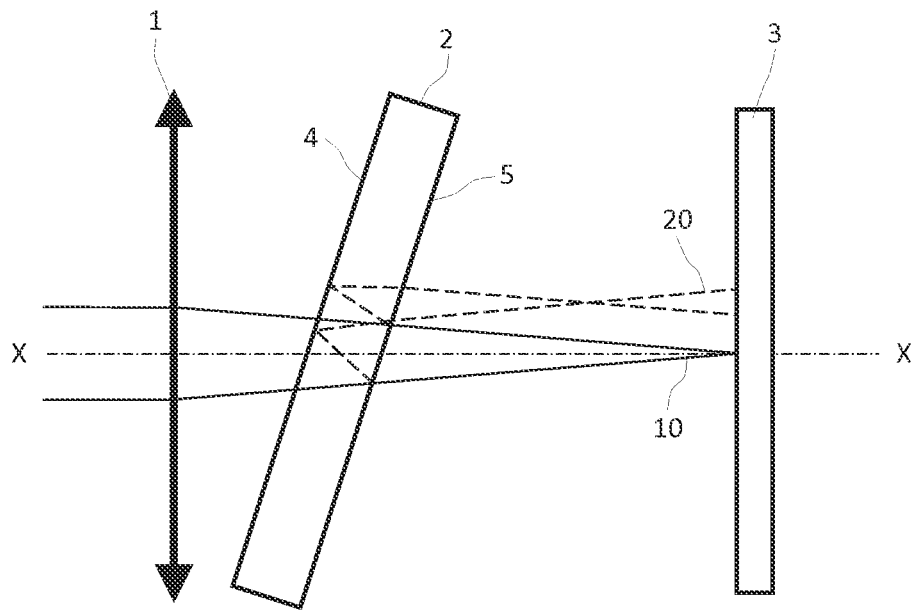
FIG. 1 represents a first embodiment of the optical plate according to the invention.

In a first configuration represented in FIG. 1, the optical plate 2 is a plate with plane and parallel faces, inclined to the optical axis X-X. This plate gives two images 10 and 20 on the sensor 3. The first image 10 is obtained by transmission through the optical plate 2, the second image is obtained after double reflection on the two faces 4 and 5 of the optical plate. This second image 20 is shifted and defocused with respect to the first image 10. In FIG. 1, the image 10 is focused and the image 20 is defocused. It is possible, of course, to adopt the inverse configuration, that is to say to focus the image 20 and to defocus the image 10. It suffices to displace the photoreceptor reception plane.

Figure 2:
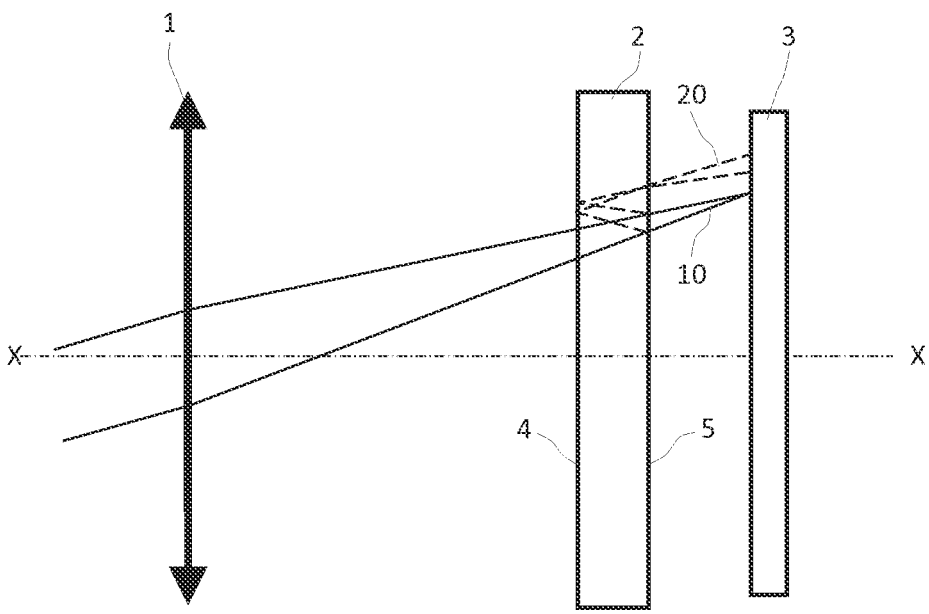
FIG. 2 represents a variant of this first embodiment of the optical plate according to the invention.

The values of the shift and of the defocusing depend on the thickness of the plate, on its optical index, on its inclination and on the geometry of the light beams and are easily calculable. Thus, at the edge of the field, the light beams may be sufficiently inclined for the optical plate to be able to be perpendicular to the optical axis X-X as is seen in FIG. 2. This plate introduces geometric aberrations and in particular astigmatism that can be compensated for either by taking account of the optical architecture in the calculation, or by giving the optical plate a particular shape.

Figure 3:
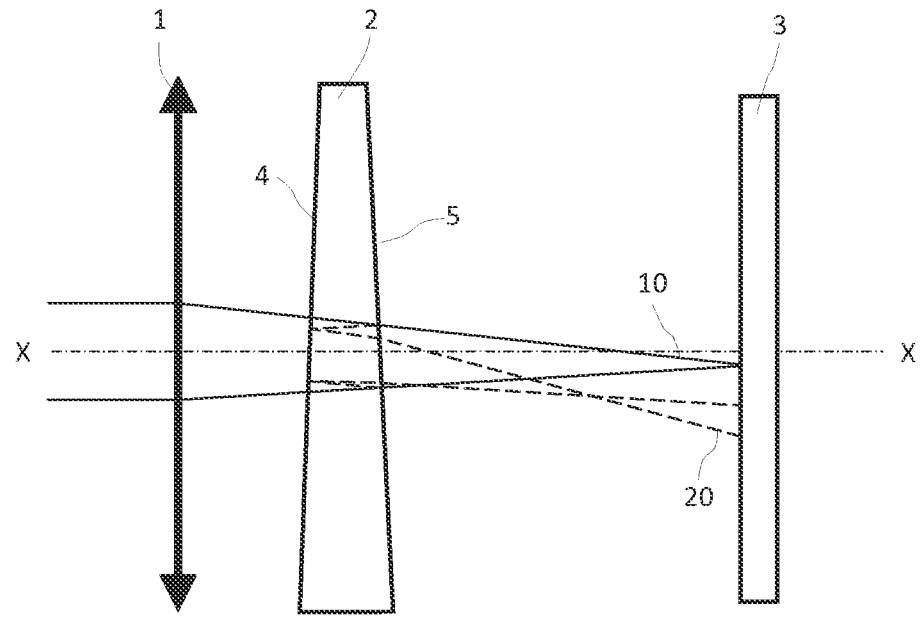
FIG. 3 represents a second embodiment of the optical plate according to the invention.

In a second configuration represented in FIG. 3, the optical plate 2 is a prism with substantially plane faces, perpendicular to the optical axis X-X. This plate also gives two images 10 and 20 on the sensor 3. The first image 10 is obtained by transmission through the optical plate 2, the second image is obtained after double reflection on the two faces 4 and 5 of the optical plate. This second image 20 is shifted and defocused with respect to the first image 10. The values of the shift and of the defocusing depend on the thickness of the plate, on its optical index, on the angle of the prism and on the geometry of the light beams. This plate introduces chromatic aberrations that can be compensated for either by taking account of the optical architecture in the calculation, or by using a prism composed of two prismatic plates arranged head-to-tail and corrected of chromatism.

In a variant of the two previous configurations, it is possible to use an air plate whose faces are on the one hand the entrance face of the photoreception assembly and on the other hand one of the faces of a protection window arranged in front of the said photoreception assembly, the first image being obtained in simple transmission through the said protection window, the second image being obtained in transmission after double reflection on the entrance face of the photoreception assembly and on the face of the protection window.

Figure 4:
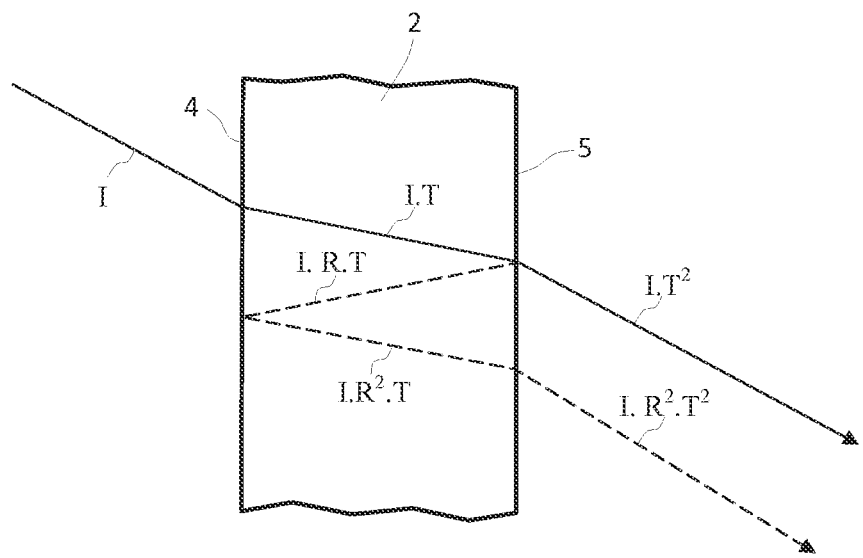
FIG. 4 represents the respective intensities of the first image and of the second image obtained by transits through the optical plate of the first and of the second embodiment.
Figure 6:
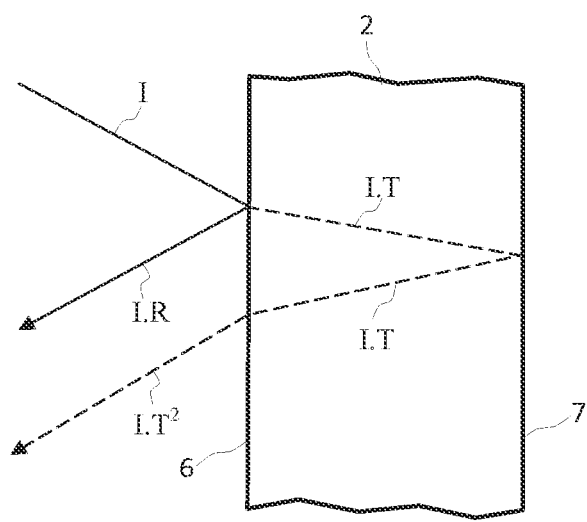
FIG. 6 represents the respective intensities of the first image and of the second image obtained by transits through the optical plate of the third embodiment.

The two images must have similar intensities. As seen in FIG. 4, if I is the intensity of the image without the optical plate and if it is assumed that the faces of the optical plate have the same coefficients of transmission T and of reflection R, it is easily demonstrated that the first image has an intensity $I \cdot T^2$ and the second image has an intensity $I \cdot T^2 R^2$. In FIGS. 4 and 6, only the track of one light ray is represented.

Figure 5:
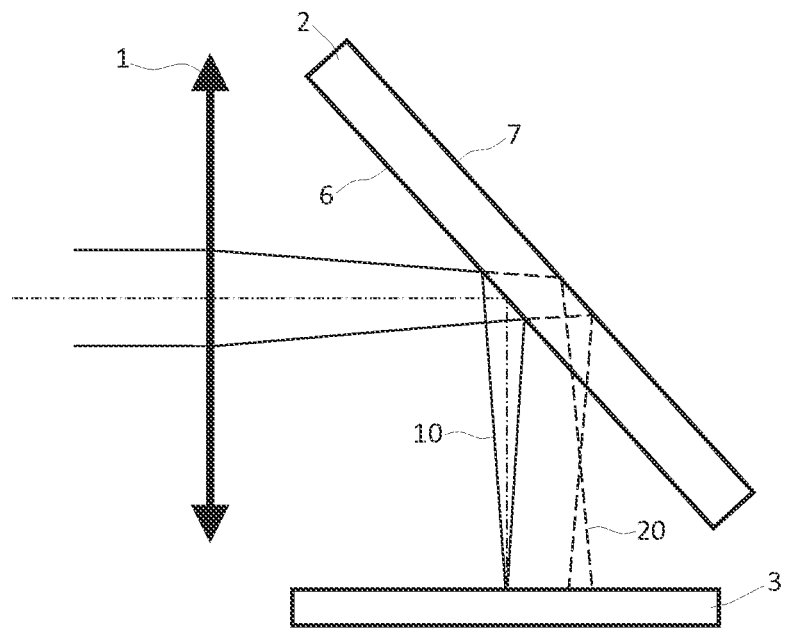
FIG. 5 represents a third embodiment of the optical plate according to the invention.

In a variant represented in FIGS. 5 and 6, it is also possible to use the optical plate 2 according to the invention in reflection. In this case, the optical plate 2 is a Mangin mirror, that is to say an optical plate comprising a first semi-reflecting face 6 and a second reflecting face 7, the first image 10 being obtained by reflection on the first semi-reflecting face 6, the second image 20 being obtained by reflection on the second reflecting face 7.

The two images must have similar intensities. As seen in FIG. 6, if I is the intensity of the image without the optical plate, if the first face 6 of the optical plate has transmission coefficient T and reflection coefficient R and if the second face 7 is perfectly reflecting, it is easily demonstrated that the first image has an intensity $I \cdot R$ and the second image has an intensity $I \cdot T^2$. It is then easy to equalize the intensities of the two images.

The invention claimed is:

1. An optic instrument, comprising:
an optical architecture comprising an optical assembly intended to make an image of a luminous object, and
a photoreception assembly and means for acquisition and analysis of the said image, the said acquisition and analysis means comprising an algorithm of phase diversity type,
wherein the optical architecture comprises an optical plate of low or zero optical power arranged in the vicinity of the photoreception assembly and disposed so as to form on all or part of the said assembly a first focused image and a second image defocused by a first predetermined value and shifted by a second predetermined value with respect to the first image.

2. The optic instrument according to claim 1, wherein, the instrument having an optical axis, the optical plate is a plate with mutually parallel plane faces perpendicular to the optical axis, the first image being obtained in simple transmission through the said optical plate, the second image being obtained in transmission after double reflection on the two faces of the plate.

3. The optic instrument according to claim 2, wherein the optical plate is situated at the edge of the photoreception assembly.

4. The optic instrument according to claim 1, wherein, the instrument having an optical axis, the optical plate is a plate with plane and parallel faces inclined to the optical axis, the first image being obtained in simple transmission through the said optical plate, the second image being obtained in transmission after double reflection on the two faces of the plate.

5. The optic instrument according to claim 1, wherein the optical plate is a prism with plane faces, the first image being obtained in simple transmission through the said prism, the second image being obtained in transmission after double reflection on the two faces of the said prism.

6. The optic instrument according to claim 1, wherein the optical plate is an air plate whose faces are on the one hand the entrance face of the photoreception assembly and on the other hand one of the faces of a protection window arranged in front of the said photoreception assembly, the first image being obtained in simple transmission through the said protection window, the second image being obtained in transmission after double reflection on the entrance face of the photoreception assembly and on the face of the protection window.

7. The optic instrument according to claim 1, wherein the optical plate is a Mangin mirror, that is to say an optical plate comprising a first semi-reflecting face and a second reflecting face, the first image being obtained by reflection on the first semi-reflecting face, the second image being obtained by reflection on the second reflecting face.

8. The optic instrument according to claim 1, wherein the optical plate comprises one or two reflecting treatments such that the amplitude of the first focused image is of the same order of magnitude as the amplitude of the second defocused image.

9. The optic instrument according to claim 1, wherein the optic instrument is a space telescope.

\* \* \* \* \*